US012278083B2

(12) United States Patent
Okita et al.

(10) Patent No.: US 12,278,083 B2
(45) Date of Patent: Apr. 15, 2025

(54) SUBSTRATE HOLDER STATE DETECTION DEVICE AND SUBSTRATE HOLDER STATE DETECTION METHOD

(71) Applicant: SCREEN Holdings Co., Ltd., Kyoto (JP)

(72) Inventors: Yuji Okita, Kyoto (JP); Hideji Naohara, Kyoto (JP); Hiroaki Kakuma, Kyoto (JP); Tatsuya Masui, Kyoto (JP); Yuichi Deba, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 309 days.

(21) Appl. No.: 17/749,638

(22) Filed: May 20, 2022

(65) Prior Publication Data

US 2023/0009810 A1 Jan. 12, 2023

(30) Foreign Application Priority Data

Jul. 9, 2021 (JP) .................................. 2021-114286

(51) Int. Cl.
*G06T 7/00* (2017.01)
*G06T 7/73* (2017.01)
(Continued)

(52) U.S. Cl.
CPC ............ *H01J 37/222* (2013.01); *G06T 7/001* (2013.01); *G06T 7/74* (2017.01); *H01J 37/20* (2013.01);
(Continued)

(58) Field of Classification Search
CPC ...... H01J 37/222; H01J 37/20; H01J 37/3171; H01J 2237/2007; H01L 21/67253;
(Continued)

(56) References Cited

U.S. PATENT DOCUMENTS

2013/0334172 A1 12/2013 Matsumoto et al.
2015/0235368 A1* 8/2015 Kakuma .................... G06T 7/73
348/135

(Continued)

FOREIGN PATENT DOCUMENTS

JP 2005-019456 A 1/2005
JP 2010-232523 A 10/2010
(Continued)

OTHER PUBLICATIONS

Office Action with Search Report dated Apr. 10, 2023 in corresponding Taiwanese Patent Application No. 111121128 and computer-generated English translation made from the Japanese translation of the original communication.

(Continued)

*Primary Examiner* — Oneal R Mistry
*Assistant Examiner* — Daniel Danesh Najarian
(74) *Attorney, Agent, or Firm* — OSTROLENK FABER LLP

(57) ABSTRACT

A state detection device includes at least one chuck pin for holding a substrate, a photographing unit configured to photograph the chuck pin, and set at least one image to be obtained as a target image, a matching coordinate calculation unit, namely a data matching calculator, configured to perform matching processing between the target image and a reference image which is at least one image showing the chuck pin, and calculate matching coordinates, which are coordinates indicating a position of the reference image in the target image when a matching score between the reference image and the target image is the highest, and a detection unit, namely a detector, configured to detect an open/closed state of the chuck pin based on the matching coordinates. Therefore, the open/closed state of the chuck (Continued)

pin can be detected while maintaining high detection accuracy.

10 Claims, 10 Drawing Sheets

(51) Int. Cl.
*H01J 37/20* (2006.01)
*H01J 37/22* (2006.01)
*H01J 37/317* (2006.01)

(52) U.S. Cl.
CPC . *G06T 2207/30148* (2013.01); *H01J 37/3171* (2013.01); *H01J 2237/2007* (2013.01)

(58) Field of Classification Search
CPC ......... H01L 21/67051; H01L 21/67259; H01L 21/68728; H01L 21/6708; G06T 7/001; G06T 7/74; G06T 2207/30148
See application file for complete search history.

(56) References Cited

U.S. PATENT DOCUMENTS

| | | | |
|---|---|---|---|
| 2018/0053319 A1* | 2/2018 | Kakuma | ........... H01L 21/67259 |
| 2020/0167946 A1 | 5/2020 | Kwon et al. | |
| 2021/0210366 A1* | 7/2021 | Watanabe | ........... H01L 21/6838 |
| 2022/0319893 A1* | 10/2022 | Maki | ....................... H01L 22/34 |

FOREIGN PATENT DOCUMENTS

| | | | | |
|---|---|---|---|---|
| JP | 2013-110270 A | 6/2013 | | |
| JP | 2020-034344 A | 3/2020 | | |
| KR | 10-2010-0109202 A | 10/2010 | | |
| KR | 10-2015-0106368 A | 9/2015 | | |
| KR | 10-2018-0020880 A | 2/2018 | | |
| WO | WO-2020044884 A1 * | 3/2020 | ........... G01B 11/002 | |

OTHER PUBLICATIONS

Request for the Submission of an Opinion dated Jan. 24, 2024 in corresponding Korean Patent Application No. 10-2022-0082368 and a computer-generated English translation obtained from the JPO.

Notice of Decision to Grant dated Jul. 15, 2024 in corresponding Korean Patent Application No. 10-2022-0082368.

Decision of Grant dated Mar. 4, 2025 in corresponding Japanese Patent Application No. 2021-114286.

* cited by examiner

SUBSTRATE HOLDER STATE DETECTION DEVICE AND SUBSTRATE HOLDER STATE DETECTION METHOD

BACKGROUND OF THE INVENTION

Field of the Invention

The technique disclosed herein relates to an image-based detection technique.

Description of the Background Art

In the substrate processing apparatus, the open/closed state of the chuck pin for holding the substrate is detected by a sensor or the like provided in the holding unit for holding the substrate and arranged at the end portion of the substrate (for example, see, Japanese Patent Application Laid-Open No. 2010-232523).

The sensor arranged at the end portion of the substrate is contaminated with the detection portion due to the adhesion of the treatment solution supplied from the nozzle during the substrate treatment or the mist formed by the treatment solution, and as a result, the detection accuracy may lowered in some cases.

SUMMARY OF THE INVENTION

The present invention is directed to a state detection device and a state detection method.

An aspect of the present invention is a state detection device including: at least one chuck pin for holding a substrate, a photographing unit configured to photograph at least a part of the chuck pin, and set at least one image to be obtained as a target image, a matching coordinate calculation unit configured to perform matching processing between the target image and a reference image which is at least one image including a part of the chuck pin, and calculate matching coordinates, which are coordinates indicating a position of the reference image in the target image when a matching score between the reference image and the target image is the highest, and a detection unit configured to detect an open/closed state of the chuck pin based on the matching coordinates.

The open/closed state of the chuck pin can be detected based on the matching coordinates calculated by performing the matching processing using the target image obtained by photographing the chuck pin. Hence, even if a sensor or the like is not arranged at the end portion of the substrate, it is sufficient to have a camera or the like that photographs an image of the chuck pin; therefore, the open/closed state of the chuck pin can be detected while detection accuracy is suppressed from lowering.

An aspect of the present invention is a state detection method including the steps of: obtaining at least one image including a portion of at least one chuck pin for holding the substrate, as a reference image; obtaining at least one image obtained by photographing at least a part of the chuck pin, as a target image; performing matching processing between the reference image and the target image and calculating matching coordinates, which are coordinates indicating a position of the reference image in the target image when a matching score between the reference image and the target image is the highest; and detecting an open/closed state of the chuck pin based on the matching coordinates.

The open/closed state of the chuck pin can be detected based on the matching coordinates calculated by performing the matching processing using the target image obtained by photographing the chuck pin. Hence, even if a sensor or the like is not arranged at the end portion of the substrate, it is sufficient to have a camera or the like that photographs an image of the chuck pin; therefore, the open/closed state of the chuck pin can be detected while detection accuracy is suppressed from lowering.

Therefore, an object of the present invention is to detect the open/closed state of the chuck pin while detection accuracy is suppressed from lowering.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
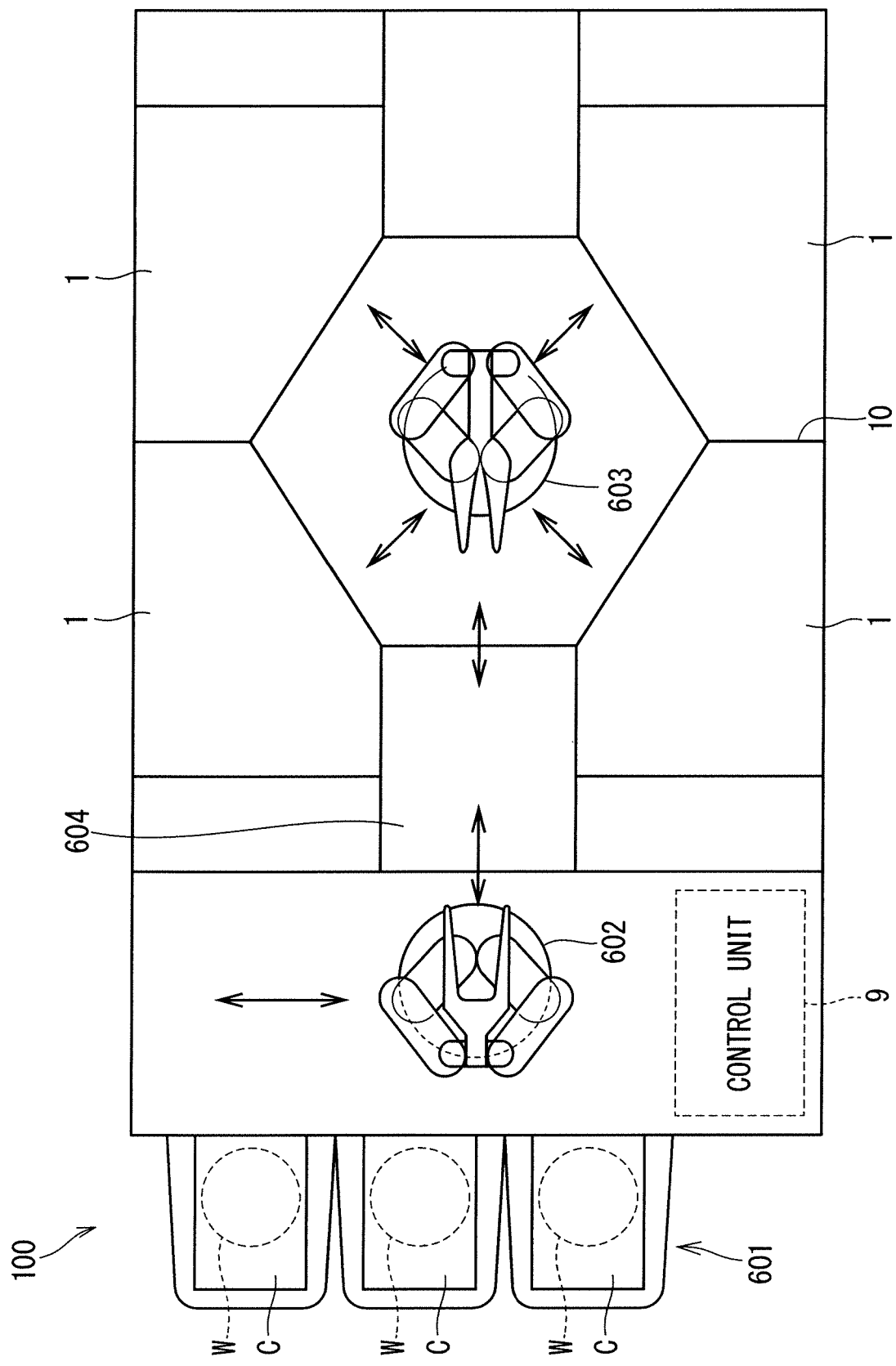
FIG. 1 is a diagram showing an overall configuration of a substrate processing apparatus according to an embodiment.

Hereinafter, an embodiment will be described with reference to the attached drawings. In the following embodiment, although detailed features and the like are also shown for explaining the technique, they are mere examples, and not all of them are necessarily essential features in order for the embodiment to be implemented.

It should be noted that the drawings are shown schematically, and for convenience of description, the configuration is to be omitted or the configuration is to be simplified as appropriate in the drawings. Also, the mutual relationship among sizes and positions in configurations and the like illustrated in different drawings are not necessarily accurately described, and may be changed as appropriate. In addition, in the drawings such as plan views that are not cross-sectional views, hatching may be given to facilitate understanding of the contents of embodiments.

In addition, in the following description, the same components are denoted by the same reference numerals, and the names and functions thereof are also similar. Accordingly, detailed descriptions thereof may be omitted to avoid redundancy.

Also, in the description to be made in the specification of the present application, expressions that an X "is provided with", "includes", or "has" a component are not exclusive expressions that exclude the existence of other components unless otherwise specified.

Also, in the description to be made in the specification of the present application, even though ordinal numbers such as "first", and "second" may be used, these terms are for promoting the understanding of the contents of embodiments and contents of the embodiments are not defined by the order caused by such ordinal numbers.

Also, in the description to be made in the specification of the present application, terms that express the relative or absolute positional relationship (for example, "in one direction" "along one direction", "parallel", "orthogonal", "center", "concentric", "coaxial", etc.) express a state where the precise positional relationship is described, and express a state of being displaced relative to an angle or distance to the extent that tolerance or similar functionality is obtained, unless otherwise specified.

Also, in the description to be made in the specification of the present application, even though terms indicating specific positions or directions such as "upper", "lower", "left", "right", "side", "bottom", "front", and "back" may be used, these terms are for promoting the understanding of the contents of embodiments and are not related to the positions or directions at the time of implementation of the embodiments.

Embodiment

Hereinafter, a state detection device and a state detection method according to the present embodiment will be described.

Configuration of Substrate Processing Apparatus

FIG. 1 is a plan view schematically showing an example of a configuration of a substrate processing apparatus 100 according to an embodiment. The substrate processing apparatus 100 includes a load port 601, an indexer robot 602, a center robot 603, a control unit 9, and at least one treatment unit 1 (four processing units in FIG. 1).

The substrates to be processed include, for example, semiconductor wafers, glass substrates for liquid crystal displays, flat panel display (FPD) substrates such as organic EL (electroluminescence) display devices, optical disk substrates, magnetic disk substrates, magneto-optical substrates, glass substrates for photomask, ceramic substrates, substrates for field emission displays (i.e., FEDs), substrates for solar cells, or the like.

The substrate processing apparatus 100 performs a cleaning process on a substrate W, which is a silicon substrate having a circular thin plate shape, with a rinsing solution such as a chemical solution and pure water, and then performs a drying process thereof.

As the above-mentioned chemical solution, for example, a mixed solution of ammonia and hydrogen peroxide solution (SC1), a mixed aqueous solution of hydrochloric acid and hydrogen peroxide solution (SC2), a dilute hydrofluoric acid solution (DHF), or the like is used.

In the following description, the chemical solution and the rinsing solution are collectively referred to as "treatment solution". In addition to the solutions for the cleaning process, a coating solution such as a photoresist solution for film formation process, a chemical solution for removing unnecessary films, or a chemical solution for etching are also included in the "treatment solution".

The treatment unit 1 is a single-wafer type device applicable to the substrate processing, and specifically, is a device that performs processing for removing organic substances adhering to the substrate W. The organic substances adhering to the substrate W are, for example, a used resist film. The resist film is used, for example, as an implantation mask for an ion implantation process.

The treatment unit 1 can have a chamber 10. In that case, by controlling the atmosphere in the chamber 10 by the control unit 9, the treatment unit 1 can perform substrate processing in a desired atmosphere.

The control unit 9 controls the operation of each element of the substrate processing apparatus 100. A carrier C is a container for accommodating the substrate W. Further, the load port 601 is a container holding mechanism for holding a plurality of carriers C. The indexer robot 602 conveys the substrate W between the load port 601 and a substrate mounting portion 604. The center robot 603 conveys the substrate W between the substrate mounting portion 604 and the treatment unit 1.

With the above configuration, the indexer robot 602, the substrate mounting portion 604, and the center robot 603 function as a conveyance mechanism for conveying the substrate W between the respective treatment unit 1 and the load port 601.

The unprocessed substrate W is taken out from the carrier C by the indexer robot 602. Then, the unprocessed substrate W is delivered to the center robot 603 via the substrate mounting portion 604.

The center robot 603 conveys the unprocessed substrate W into the treatment unit 1. Then, the treatment unit 1 processes the substrate W.

The substrate W processed in the treatment unit 1 is taken out from the treatment unit 1 by the center robot 603. Then, the processed substrate W is delivered to the indexer robot 602 via the substrate mounting portion 604 after passing through another treatment unit 1 as needed. The indexer robot 602 conveys the processed substrate W into the carrier C. Accordingly, the processing for the substrate W is performed.

Figure 2:
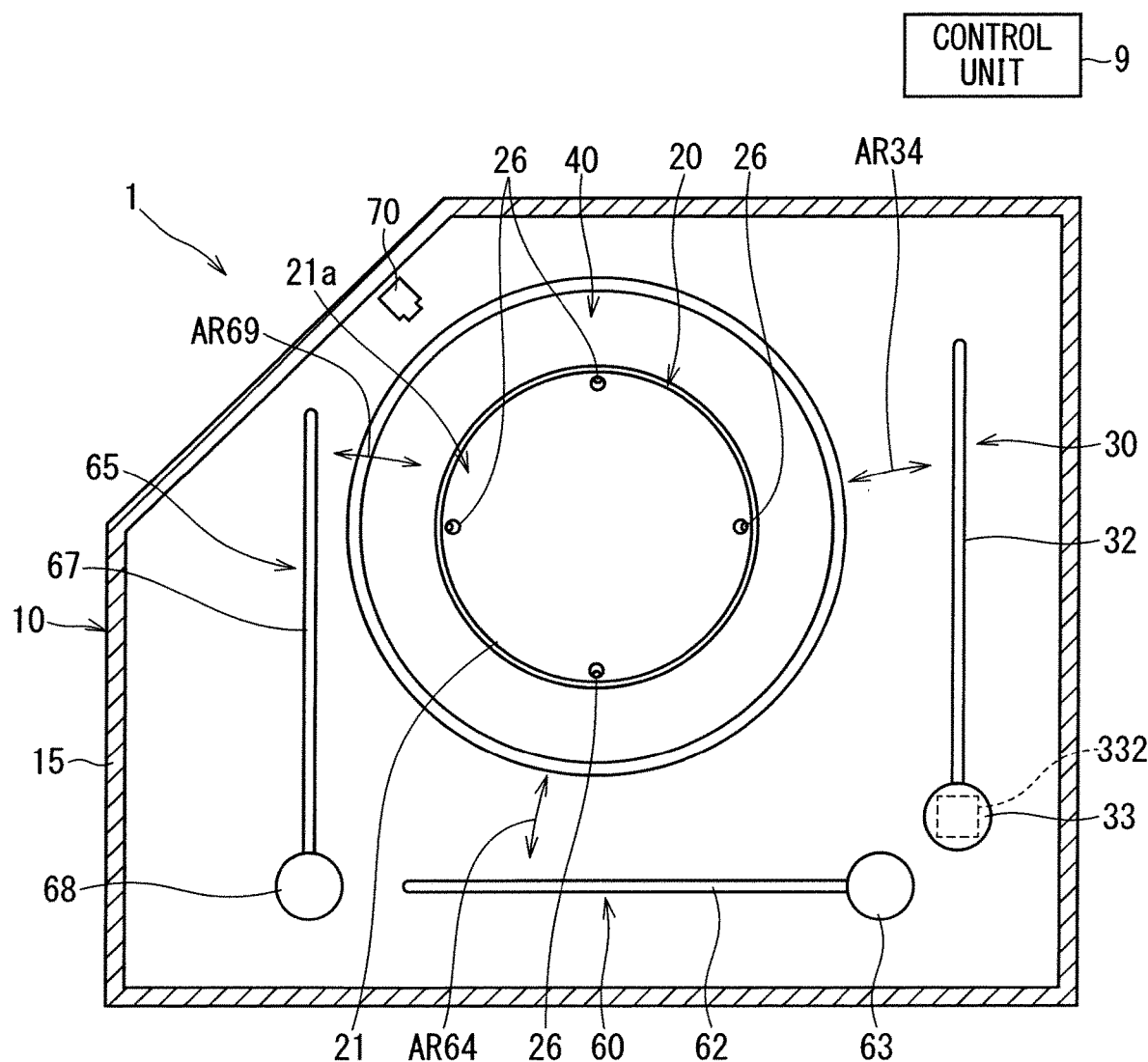
FIG. 2 is a plan view of a processing unit according to the embodiment.
Figure 3:
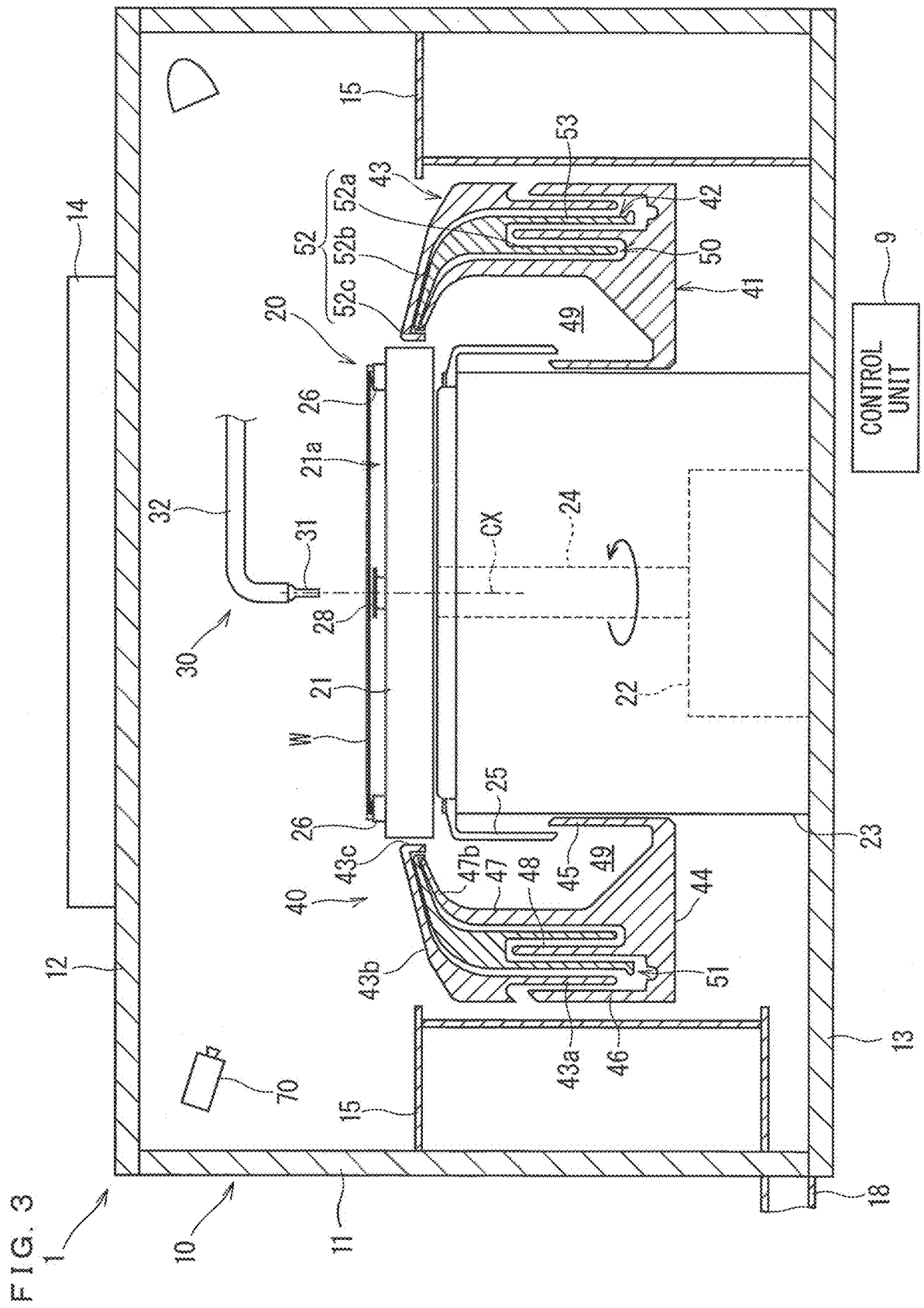
FIG. 3 is a cross-sectional view of the processing unit according to the embodiment.

FIG. 2 is a plan view of the treatment unit 1 according to the embodiment, and FIG. 3 is a cross-sectional view of the treatment unit 1 according to the embodiment.

FIG. 2 shows a state in which the substrate W is not held by a spin chuck 20, and FIG. 3 shows a state in which the substrate W is held by the spin chuck 20.

The treatment unit 1 includes the spin chuck 20 that holds the substrate W in a horizontal posture (that is, a posture in which the normal of the upper surface of the substrate W is along the vertical direction) in the chamber 10, three nozzles: nozzle 30, nozzle 60, and nozzle 65 for supplying the treatment solution to the upper surface of the substrate W held by the spin chuck 20, a treatment cup 40 surrounding the spin chuck 20, and a camera 70 that photographs the spin chuck 20.

Further, around the treatment cup 40 in the chamber 10, a partition plate 15 for vertically partitioning the inner space of the chamber 10 is provided.

The chamber 10 includes a side wall 11 that extends along the vertical direction and surrounds all four sides, a ceiling wall 12 that closes the upper side of the side wall 11, and a floor wall 13 that closes the lower side of the side wall 11.

The space surrounded by the side wall 11, the ceiling wall 12, and the floor wall 13 forms a treatment space for the substrate W.

Further, a part of the side wall 11 of the chamber 10 is provided with a carrying in/out port through which the center robot 603 conveys the substrate W into and out of the chamber 10 and a shutter for opening/closing the carrying in/out port (both not shown).

A fan filter unit (FFU) 14 for further purifying the air in the clean room in which the substrate processing apparatus 100 is installed and supplying the air to the processing space in the chamber 10 is attached to the ceiling wall 12 of the chamber 10. The FFU14 is equipped with a fan and filter (for example, a high efficiency particulate air (HEPA) filter) for taking in the air in the clean room and sending the air out into the chamber 10.

FFU 14 forms a downflow of clean air in the processing space within the chamber 10. In order to uniformly disperse the clean air supplied from the FFU 14, a punching plate having a large number of blowout holes may be provided directly below the ceiling wall 12.

The spin chuck 20 includes a spin base 21, a spin motor 22, a cover member 23, and a rotation shaft 24. The spin base 21 has a disk shape and is fixed in a horizontal posture to the upper end of the rotation shaft 24 extending in the vertical direction. The spin motor 22 is provided below the spin base 21 and rotates the rotation shaft 24. The spin motor 22 rotates the spin base 21 in a horizontal plane via the rotation shaft 24. The cover member 23 has a cylindrical shape that surrounds the spin motor 22 and the rotation shaft 24.

The outer diameter of the disk-shaped spin base 21 is slightly larger than the diameter of the circular substrate W held by the spin chuck 20. The spin base 21 has a holding surface 21a facing the entire lower surface of the substrate W to be held.

A plurality of (four in the embodiment) chuck pins 26 are provided on the peripheral edge portion of the holding surface 21a of the spin base 21. The plurality of chuck pins 26 are arranged at equal intervals along the circumference corresponding to the outer diameter of the outer peripheral circle of the circular substrate W. In the embodiment, the four chuck pins 26 are provided at 90° intervals.

The plurality of chuck pins 26 are driven in conjunction with each other by a link mechanism (not shown) accommodated in the spin base 21. The spin chuck 20 grips the substrate W by bringing each of the plurality of chuck pins 26 into contact with the outer peripheral end of the substrate W, so that the substrate W is held in a horizontal posture above the spin base 21 and close to the holding surface 21a (see FIG. 3). Further, the spin chuck 20 releases the grip of the substrate W by separating each of the plurality of chuck pins 26 from the outer peripheral end of the substrate W.

At least one of the plurality of chuck pins 26 is configured to be able to be held at the outer peripheral end of the substrate W by a magnet, a spring, or the like, and maintain a respective open state which is a state of being separated from the outer peripheral end of the substrate W and a closed state which is a state of being in contact with the outer peripheral end of the substrate W. The drive of the chuck pins 26 is controlled by the control unit 9.

When only some of the plurality of chuck pins 26 are driven so as to grip the substrate W, the other chuck pins 26 may be support pins that support the lower surface of the substrate W.

The lower end of the cover member 23 covering the spin motor 22 is fixed to the floor wall 13 of the chamber 10, and the upper end thereof reaches directly below the spin base 21. At the upper end portion of the cover member 23, a flange-shaped member 25 is provided which projects outward from the cover member 23 substantially horizontally and further bends downward and extends.

While the spin chuck 20 holds the substrate W by gripping with the plurality of chuck pins 26, the spin motor 22 rotates the rotation shaft 24 so as to rotate the substrate W around the rotation axis CX along the vertical direction passing through the center of the substrate W. The drive of the spin motor 22 is controlled by the control unit 9.

The nozzle 30 is configured by attaching a discharge head 31 to the tip of the nozzle arm 32. The base end side of the nozzle arm 32 is fixed on and connected to a nozzle base 33. A motor 332 (nozzle moving unit) provided on the nozzle base 33 enables rotation around an axis extending along the vertical direction.

The rotation of the nozzle base 33 moves the nozzle 30 in the horizontal direction in a circular-arc trajectory between the position above the spin chuck 20 and the standby position outside the treatment cup 40, as shown by the arrow AR34 in FIG. 2. The rotation of the nozzle base 33 makes the nozzle 30 swing above the holding surface 21a of the spin base 21.

In addition to the nozzle 30 described above, the treatment unit 1 of the present embodiment is further provided with two nozzles; a nozzle 60 and a nozzle 65. The nozzle 60 and the nozzle 65 of the present embodiment have the same configuration as that of the nozzle 30 described above.

That is, the nozzle 60 is configured by attaching a discharge head to the tip of a nozzle arm 62, and moves, as shown by the arrow AR64, between the treatment position above the spin chuck 20 and the stand by position outside the treatment cup 40 in a circular-arc trajectory, by the nozzle base 63 connected to the nozzle arm 62 on the base end side.

Similarly, the nozzle 65 is configured by attaching a discharge head to the tip of a nozzle arm 67, and moves, as shown by the arrow AR69, between the treatment position above the spin chuck 20 and the stand by position outside the treatment cup 40 in a circular-arc trajectory, by the nozzle base 68 connected to the nozzle arm 67 on the base end side.

The nozzle 60 and the nozzle 65 are also configured to supply a plurality of types of treatment solutions containing at least pure water, and the treatment solutions are discharged to the upper surface of the substrate W held by the spin chuck 20 at the treatment position.

A bottom surface treatment solution nozzle 28 is provided along the vertical direction so as to pass through the inside of the rotation shaft 24. The upper end opening of the bottom surface treatment solution nozzle 28 is formed at a position facing the center of the bottom surface of the substrate W held by the spin chuck 20. The bottom surface treatment solution nozzle 28 is also configured to supply a plurality of types of treatment solutions. The treatment solutions discharged from the bottom surface treatment solution nozzle 28 lands on the bottom surface of the substrate W held by the spin chuck 20.

The drive of the nozzle 30, the nozzle 60, the nozzle 65, and the bottom surface treatment solution nozzle 28 is controlled by the control unit 9.

The treatment cup 40 surrounding the spin chuck 20 includes an inner cup 41, a middle cup 42, and an outer cup 43 each of which independently rises and falls. The inner cup 41 has a shape that surrounds the spin chuck 20 and is substantially rotationally symmetric with respect to the rotation axis CX passing through the center of the substrate W held by the spin chuck 20. The inner cup 41 integrally includes a bottom portion 44 having an annular shape in plan view, an inner wall portion 45 having a cylindrical shape and rising upward from the inner peripheral edge of the bottom portion 44, an outer wall portion 46 having a cylindrical shape and rising upward from the outer peripheral end of the bottom portion 44, the first guide portion 47 that rises from between the inner wall portion 45 and the outer wall portion 46, and the upper end portion extends diagonally upward toward the center side (direction approaching the rotation axis CX of the substrate W held by the spin chuck 20) with a smooth arc, and a middle wall portion 48 having a cylindrical shape that rises upward from between the first guide portion 47 and the outer wall portion 46.

The inner wall portion 45 is formed to have a length such that the inner wall portion 45 is accommodated with an appropriate gap between the cover member 23 and thereof and a gap between the flange-shaped member 25 and thereof in a state where the inner cup 41 is most raised. The middle wall portion 48 is formed to have a length such that the middle wall portion 48 is accommodated with an appropriate gap between a second guide portion 52 and thereof a gap between a treatment solution separation wall 53 and thereof (the second guide portion 52 and the treatment solution separation wall 53 will be described later) in a state when the inner cup 41 and the middle cup 42 are closest to each other.

The first guide portion 47 has an upper end portion 47b extending diagonally upward toward the center side (direction approaching the rotation axis CX of the substrate W) with a smooth arc. Further, a discharging groove 49 for collecting and disposing of the used treatment solution is provided between the inner wall portion 45 and the first guide portion 47. An annular inner recovery groove 50 for collecting and recovering the used treatment solution is provided between the first guide portion 47 and the middle wall portion 48. Further, an annular outer recovery groove 51 for collecting and recovering a treatment solution of a different type from that in the inner recovery groove 50 is provided between the middle wall portion 48 and the outer wall portion 46.

The middle cup 42 has a shape that surrounds the spin chuck 20 and is substantially rotationally symmetric with respect to the rotation axis CX passing through the center of the substrate W held by the spin chuck 20. The middle cup 42 has the second guide portion 52 and the treatment solution separation wall 53 having a cylindrical shape connected to the second guide portion 52.

The second guide portion 52 has a lower end portion 52a having a cylinder shape coaxial with the lower end portion of the first guide portion 47 on the outside of the first guide portion 47 of the inner cup 41, an upper end portion 52b extending diagonally upward from the upper end of the lower end portion 52a toward the center side (direction approaching the rotation axis CX of the substrate W) having a smooth arc, and a folded portion 52c formed by folding the tip portion of the upper end portion 52b downward. The lower end portion 52a is accommodated in the inner recovery groove 50 with an appropriate gap between the first guide portion 47 and thereof and a gap between the middle wall portion 48 and thereof in a state where the inner cup 41 and the middle cup 42 are closest to each other. Further, the upper end portion 52b is provided so as to overlap an upper end portion 47b of the first guide portion 47 of the inner cup 41 in the vertical direction, and nears the upper end portion 47b of the first guide portion 47 with a minute gap held therebetween in a state where the inner cup 41 and the middle cup 42 are closest to each other. In the folded portion 52c, in the state where the inner cup 41 and the middle cup 42 are closest to each other, and the folded portion 52c horizontally overlaps with the tip of the upper end portion 47b of the first guide portion 47.

The upper end portion 52b of the second guide portion 52 is formed so that the wall thickness becomes thicker toward the lower side. The treatment solution separation wall 53 has a cylindrical shape provided so as to extend downward from the lower end outer peripheral end portion of the upper end portion 52b. The treatment solution separation wall 53 is accommodated in the outer recovery groove 51 with an appropriate gap between the middle wall portion 48 and thereof and a gap between the outer cup 43 and thereof in a state where the inner cup 41 and the middle cup 42 are closest to each other.

The outer cup 43 has a shape that is substantially rotationally symmetric with respect to the rotation axis CX passing through the center of the substrate W held by the spin chuck 20. The outer cup 43 surrounds the spin chuck 20 on the outside of the second guide portion 52 of the middle cup 42. The outer cup 43 has a function as a third guide portion. The outer cup 43 has a lower end portion 43a having a cylinder shape coaxial with the lower end portion 52a of the second guide portion 52, an upper end portion 43b extending diagonally upward from the lower end portion 43a toward the center side (direction approaching the rotation axis CX of the substrate W) with a smooth arc, and a folded portion 43c formed by folding the tip portion of the upper end portion 43b downward.

The lower end portion 43a is accommodated in the outer recovery groove 51 with an appropriate gap between the treatment solution separation wall 53 of the middle cup 42 and thereof and a gap between the outer wall portion 46 of the inner cup 41 and thereof in a state where the inner cup 41 and the outer cup 43 are closest to each other. The upper end portion 43b is provided so as to overlap the second guide portion 52 of the middle cup 42 in the vertical direction, and nears the upper end portion 52b of the second guide portion 52 with a minute gap held therebetween in a state where the middle cup 42 and the outer cup 43 are closest to each other. In the state where the middle cup 42 and the outer cup 43 are closest to each other, and the folded portion 43c horizontally overlaps with the folded portion 52c of the second guide portion 52.

The drive of the treatment cup 40 is controlled by the control unit 9.

Further, around the treatment cup 40 in the chamber 10, a partition plate 15 is provided so as to vertically partition the inner space of the chamber 10.

The outer peripheral end of the partition plate 15 is connected to the side wall 11 of the chamber 10. Further, the outer edge portion of the partition plate 15 surrounding the treatment cup 40 is formed so as to have a circular shape having a diameter larger than the outer diameter of the outer cup 43.

Further, an exhaust duct 18 is provided in the vicinity of the floor wall 13 which is also a part of the side wall 11 of the chamber 10. The exhaust duct 18 is communicated with an exhaust mechanism (not shown). Of the clean air supplied from the FFU 14 and flowing down the chamber 10, the air that has passed between the treatment cup 40 and the partition plate 15 is discharged from the exhaust duct 18 to the outside of the unit.

Figure 4:
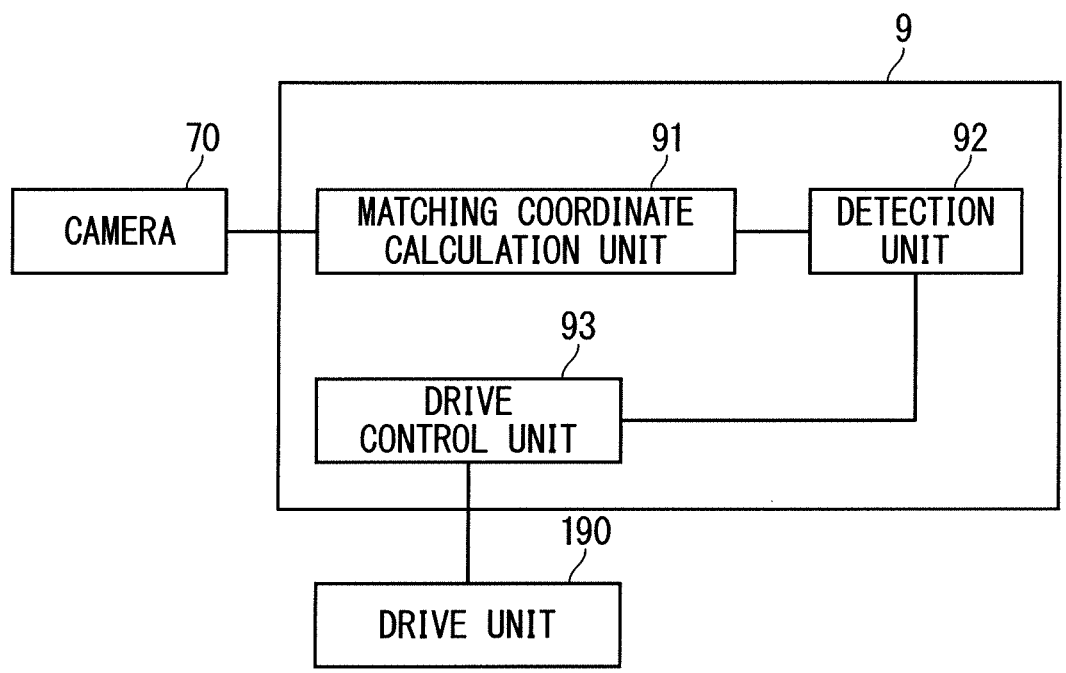
FIG. 4 is a block diagram schematically showing an example of a function of a control unit.

FIG. 4 is a block diagram schematically showing an example of a function of the control unit 9. As an example is shown in FIG. 4, the control unit 9 includes a matching coordinate calculation unit 91, a detection unit 92, and a drive control unit 93. The control unit 9 also has a function as a state detection device.

The matching coordinate calculation unit 91 performs matching processing using an image of the chuck pin photographed by the camera 70, and calculates the matching coordinates. The specific operation of the matching coordinate calculation unit 91 will be described later.

The detection unit 92 detects the open/closed state of the chuck pin 26 based on the above matching coordinates. The specific operation of the detection unit 92 will be described later.

The drive control unit 93 controls the drive of a drive unit 190 including the chuck pin 26, the spin motor 22, the nozzle 30, the nozzle 60, the nozzle 65, the bottom surface treatment solution nozzle 28, and the treatment cup 40 in the treatment unit 1. Here, for the chuck pin 26, the drive unit 190 includes a motor (not shown) for switching between the movement of the magnet or the urging and de-energizing of the spring. The drive control unit 93 may be the one that controls the drive unit 190 based on the detection result of the open/closed state of the chuck pin 26 in the detection unit 92.

Figure 5:
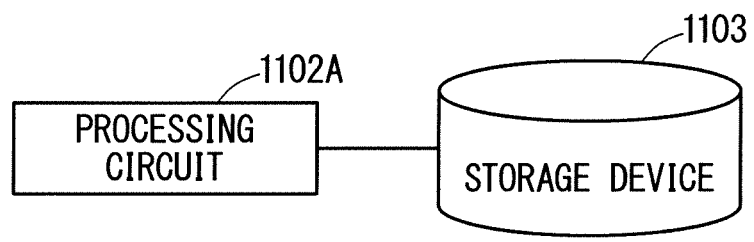
FIG. 5 is a block diagram schematically showing a hardware configuration when the control unit shown in FIG. 4 is in actual operation.

FIG. 5 is a block diagram schematically showing a hardware configuration when the control unit 9 shown in FIG. 4 is in actual operation.

In FIG. 5, as a hardware configuration for implementing the matching coordinate calculation unit 91, the detection unit 92, and the drive control unit 93 in FIG. 4, a processing circuit 1102A that performs calculation and a storage device 1103 that stores information are shown.

The processing circuit 1102A is, for example, a CPU or the like. The storage device 1103 is, for example, a memory (storage medium) such as a hard disk drive (that is, an HDD), a RAM, a ROM, and a flash memory.

Operation of Substrate Processing Apparatus

The regular processing of the substrate W in the substrate processing apparatus 100 includes a process in which the center robot 603 conveys the substrate W to be processed received from the indexer robot 602 into each treatment unit 1, a process in which the treatment unit 1 perform substrate treatment of the substrate W, and a process in which the center robot 603 conveys out the substrate W after treatment from the treatment unit 1 and returns the substrate to the indexer robot 602, where the processes are performed in this order.

Figure 6:
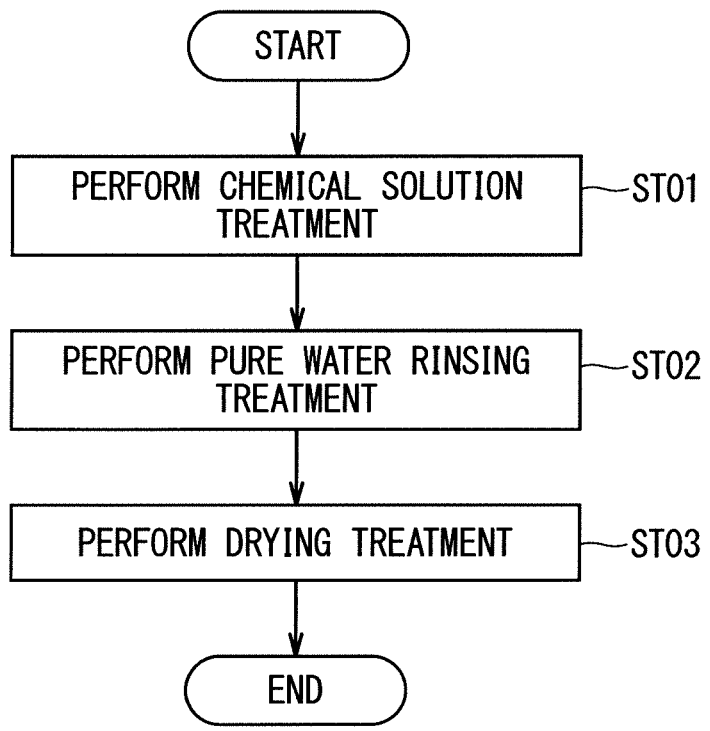
FIG. 6 is a flowchart showing the operation of the substrate processing apparatus according to the embodiment.

Next, with reference to FIG. 6, the procedures of the cleaning treatment and the drying treatment among the typical substrate treatments of the substrate W in each treatment unit 1 will be described. FIG. 6 is a flowchart showing the operation of the substrate treatment device according to the present embodiment. The following operation is mainly performed by the control of the control unit 9.

First, a chemical solution is supplied to the surface of the substrate W to perform a predetermined chemical solution treatment (Step ST01). Then, pure water is supplied to perform a pure water rinsing treatment (Step ST02).

Further, the pure water is flung off by rotating the substrate W at high speed, whereby the substrate W is dried (Step ST03).

When the treatment unit 1 performs the substrate treatment, the spin chuck 20 holds the substrate W and the treatment cup 40 moves up and down.

When the treatment unit 1 performs chemical treatment, for example, only the outer cup 43 rises and an opening surrounding the substrate W held by the spin chuck 20 is formed between the upper end portion 43b of the outer cup 43 and the upper end portion 52b of the second guide portion 52 of the middle cup 42. In this state, the substrate W is rotated together with the spin chuck 20, and the chemical solution is supplied from the nozzle 30 and the bottom surface treatment solution nozzle 28 to the upper surface and the lower surface of the substrate W. The supplied chemical solution flows along the upper surface and the lower surface of the substrate W by the centrifugal force due to the rotation of the substrate W, and is eventually scattered laterally from the outer edge portion of the substrate W. As a result, the chemical treatment of the substrate W proceeds. The chemical liquid scattered from the outer edge portion of the rotating substrate W is received by the upper end portion 43b of the outer cup 43, flows down along the inner surface of the outer cup 43, and is collected in the outer recovery groove 51.

When the treatment unit 1 performs the pure water rinsing treatment, for example, the inner cup 41, the middle cup 42, and the outer cup 43 are all raised, and the circumference of the substrate W held by the spin chuck 20 is surrounded by the first guide portion 47 of the inner cup 41. In this state, the substrate W is rotated together with the spin chuck 20, and the pure water is supplied from the nozzle 30 and the bottom surface treatment solution nozzle 28 to the upper surface and the lower surface of the substrate W. The supplied pure water flows along the upper surface and the lower surface of the substrate W by the centrifugal force due to the rotation of the substrate W, and is eventually scattered laterally from the outer edge portion of the substrate W. As a result, the pure water rinsing treatment of the substrate W proceeds. The pure water scattered from the outer edge portion of the rotating substrate W flows down along the inner wall of the first guide portion 47 and is discharged from the discharging groove 49. When pure water is collected by a separate route from that of the chemical solution, the middle cup 42 and the outer cup 43 may be raised to form an opening surrounding the substrate W held by the spin chuck 20 between the upper end portion 52b of the second guide portion 52 of the middle cup 42 and the upper end portion 47b of the first guide portion 47 of the inner cup 41.

When the treatment unit 1 performs the flinging drying treatment, the inner cup 41, the middle cup 42, and the outer cup 43 are all lowered, the upper end portion 47b of the first guide portion 47 of the inner cup 41, the upper end portion 52b of the second guide portion 52 of the middle cup 42, and the upper end portion 43b of the outer cup 43 are all located lower than the substrate W held by the spin chuck 20. In this state, the substrate W is rotated at high speed together with the spin chuck 20, the drying treatment is performed with the water droplets adhering to the substrate W being flung off by the centrifugal force.

Detection of Open/Closed State of Chuck Pin

Next, the detection (state detection) of the open/closed state of the chuck pin 26 performed by the control unit 9 will be described.

The drive of the chuck pin 26 is controlled by the drive control unit 93 of the control unit 9, and there may be a case where the chuck pin 26 does not operate as intended in drive control unit 93, due to a defect of the chuck pin 26 per se or a defect of the substrate W gripped by the chuck pin 26 (for example, when the position where the substrate W is placed is out of the predetermined position). Therefore, by detecting the open/closed state of the chuck pin 26, whether or not the chuck pin 26 is operating as instructed in the drive control unit 93 is checked. Further, depending on the result of the check, the arrangement of the substrate W is modified, or the control signal is output again from the drive control unit 93.

In the present embodiment, a plurality of images showing the chuck pins 26 are prepared and matching processing (specifically, pattern matching processing) between the images is performed, thereby calculating matching coordinates. Here, the matching coordinates represent coordinates indicating the relative positional relationship between the images when the matching score between the images is the highest.

In the present embodiment, first, three types of reference images are prepared according to the open/closed state of the chuck pin 26. The images that are to be prepared as the reference images include images specifically showing the states of the chuck pin 26 being completely closed without gripping the substrate W (first state), the chuck pin 26 gripping the substrate W (second state), and the chuck pin 26 being open (third state).

Figure 7:
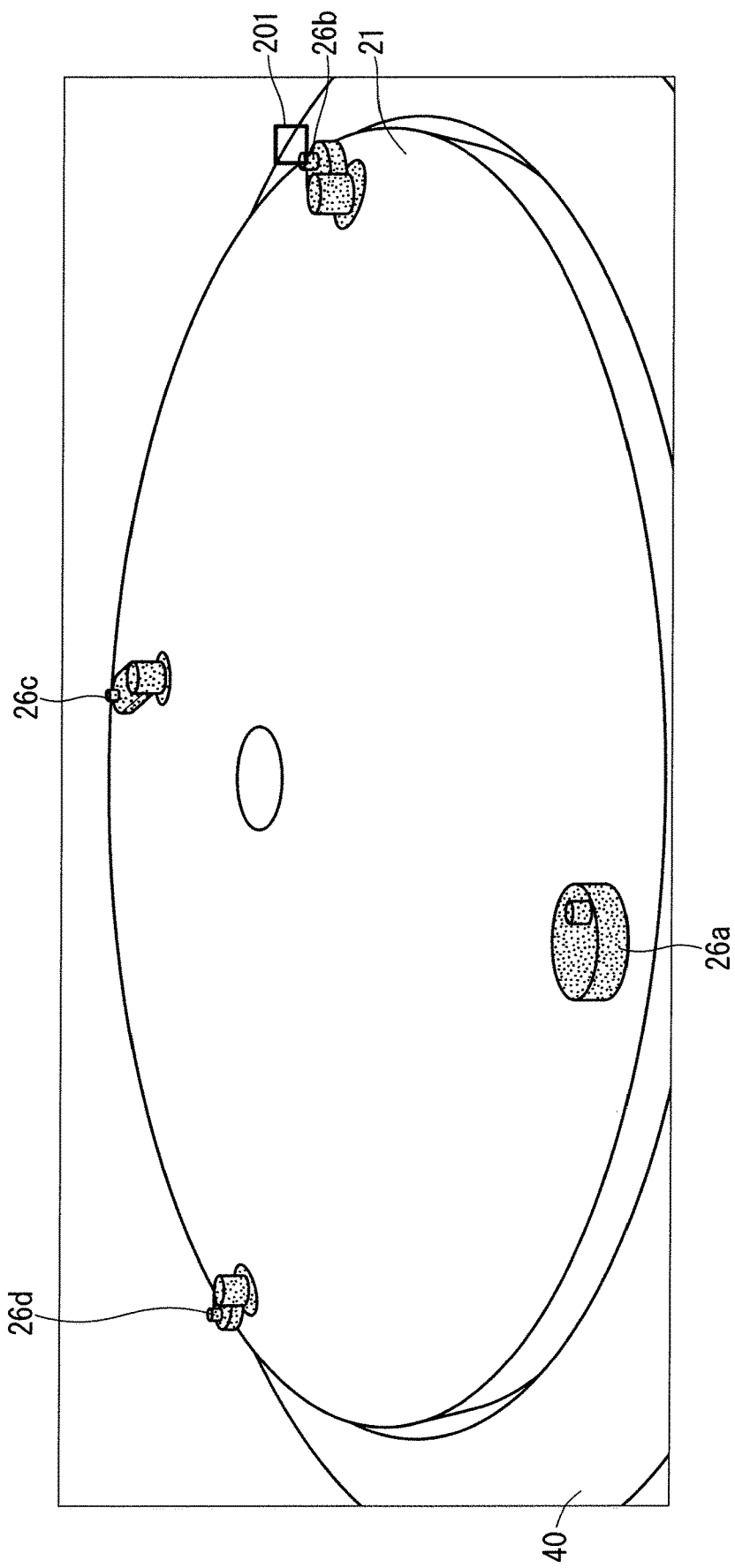
FIG. 7 is a diagram showing an example of an overall image showing an entire spin chuck for obtaining a reference image in a second state.

FIG. 7 is a diagram showing an example of an overall image showing an entire spin chuck 20 for obtaining a reference image in the first state. As an example shown in FIG. 7, in an image photographed by the camera 70 or the like, a plurality of chuck pins 26 (each chuck pin is also referred to as a chuck pin 26a, a chuck pin 26b, a chuck pin 26c, or a chuck pin 26d) are included.

From the above image, the reference image 201 for detecting the open/closed state of the chuck pin 26 is extracted. Specifically, for at least one of the plurality of chuck pins 26, a range including at least a part of the chuck pin 26 (for example, the upper end portion of the chuck pin 26 that is displaced as the chuck pin 26 opens and closes) is set as the reference image 201.

Although the reference image 201 in the present embodiment is prepared with three types for each of the plurality of chuck pins 26 according to the above-mentioned open/closed state, preparation of at least one type of reference image for at least one chuck pin 26 Image 201 may be satisfactory.

Further, the reference image 201 may be extracted from an image obtained by actually photographing the chuck pin 26 by the camera 70, or may be extracted from an image obtained by another method.

Also, an image for obtaining the reference image 201 in the second state is not limited to the case where the chuck pin 26 actually holds the substrate W, but may be realized with an image in which the chuck pin 26 maintains the same degree of opening and closing as when holding the substrate W by disabling the magnet or spring that can hold the chuck pin 26.

Further, the range of the reference image 201 in the second state should not include the substrate W. When the range of the reference image 201 does not include a portion other than the chuck pin 26, the accuracy will be improved in the matching described later.

Next, the camera 70 is used to photograph an image of the spin chuck 20 including the chuck pin 26. Then, a target image, which is an image for performing pattern matching processing with the reference image, is prepared.

Figure 8:
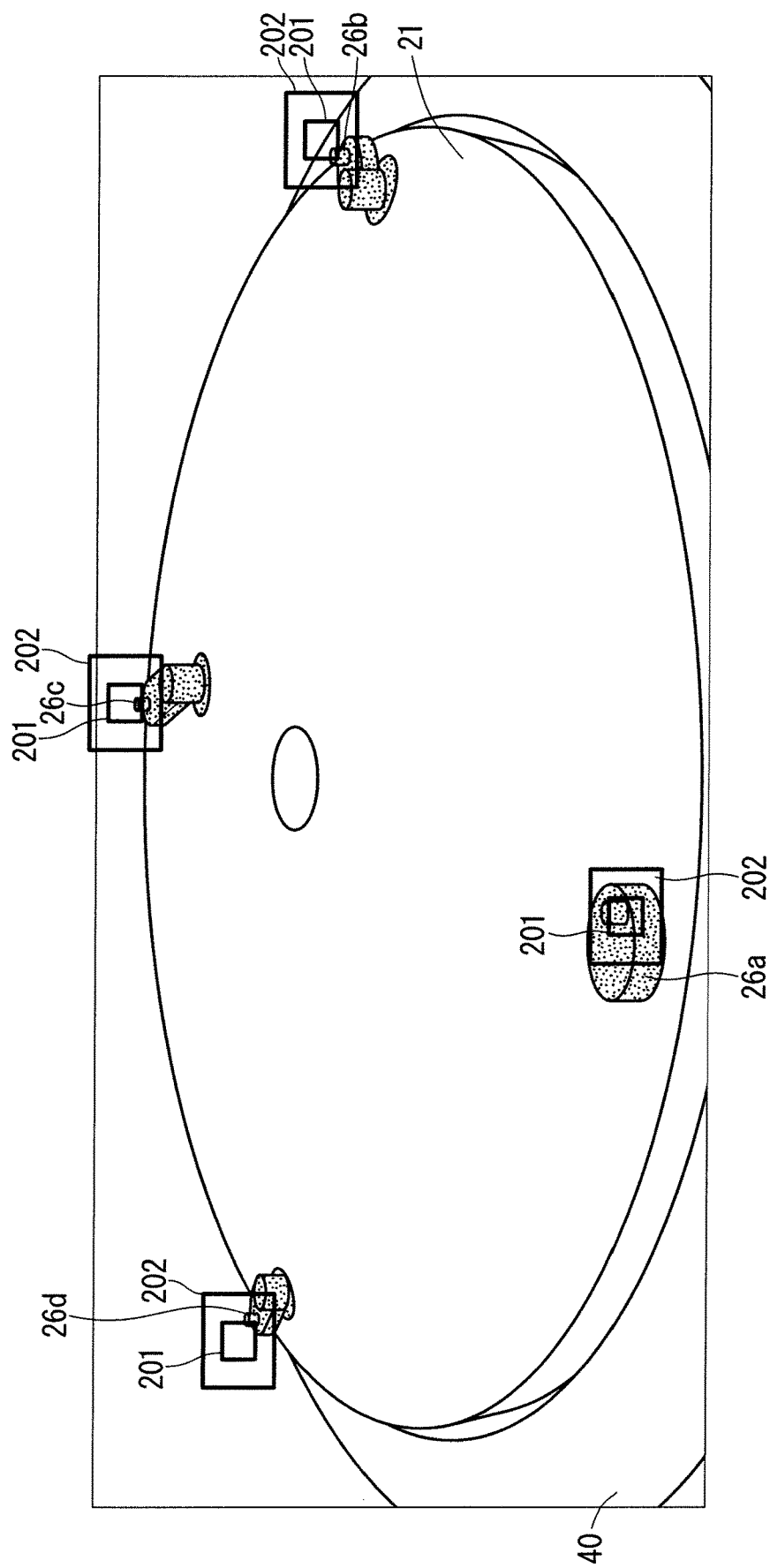
FIG. 8 is a diagram showing the spin chuck for obtaining a target image.

FIG. 8 is a diagram showing the spin chuck 20 for obtaining the target image. As shown in FIG. 8, the overall image photographed by the camera 70 or the like includes a plurality of chuck pins 26.

From the above image, the target image 202 for performing pattern matching processing with the reference image 201 is extracted. Specifically, for at least one of the plurality of chuck pins 26, a range including at least a part of the chuck pin 26 is set as the target image 202.

Here, the range of the reference image 201 can correspond to a part of the range in the target image 202. That is, the range of the target image 202 can be set wider than the range of the reference image 201. By setting the range of the target image 202 in this manner, the pattern matching processing is performed with the reference image 201 sequentially shifted within the range of the target image 202, and the matching coordinates calculated when the matching score is the highest are searched.

Figure 12:
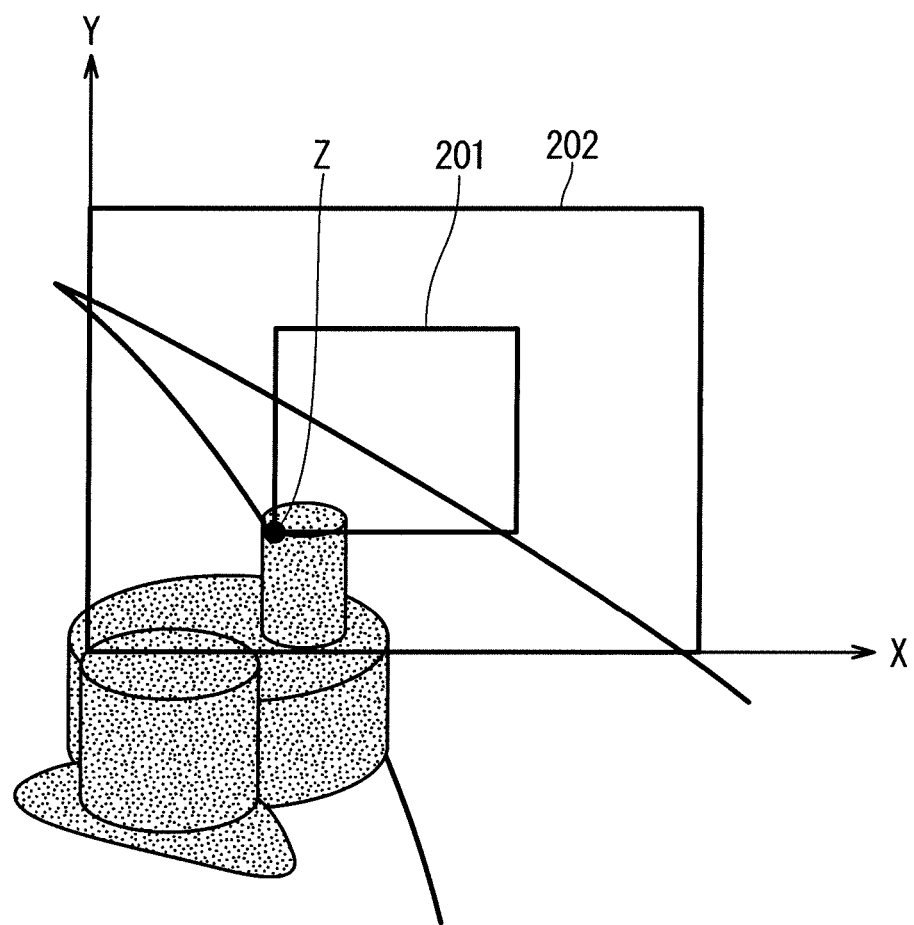
FIG. 12 is a diagram showing an example of reference coordinates in the reference image.

Specifically, first, the coordinates of a predetermined pixel of the reference image 201 in the first state of the chuck pin 26 are set as the reference coordinates ($X_{basis\_pos1}$, $Y_{basis\_pos1}$), similarly, the coordinates of the predetermined pixel of the reference image 201 in the second state of the chuck pin 26 are set as the reference coordinates ($X_{basis\_pos2}$, $Y_{basis\_pos2}$), and the coordinates of the predetermined pixel of the reference image 201 in the third state of the chuck pin 26 are set as the reference coordinates ($X_{basis\_pos3}$, $Y_{basis\_pos3}$). FIG. 12 is a diagram showing an example of reference coordinates in the reference image 201. As an example shown in FIG. 12, the reference coordinates can be set to the lower left edge (origin Z) of the corresponding reference image. The reference coordinates may be set to any location in the reference image (for example, the upper right edge of the reference image or the center of the reference image).

The reference image 201 is shown in the coordinate system of the overall image of the chuck pin 26 together with the target image 202, and is located in the coordinate system of the target image 202.

Next, assuming that the control unit 9 recognizes the current open/closed state of the chuck pin 26 as the first state, pattern matching is performed between the target image 202 and the reference image 201. Then, the coordinates of the origin Z of the reference image 201 when the matching score is the highest are searched. The case where the matching score is the highest corresponds to a case, for example, where when Sum of Squared Difference (SSD), which is one of the methods for showing the similarity between images, is used, the minimum value of the $R_{SSD}$ value which is the sum of squares of the differences between the pixel values showing the similarity. In pattern matching, other methods for showing the similarity between images include, but are not limited to, Sum of Absolute Difference (SAD) or Normalized Cross-Correlation (NCC).

Here, when the highest matching score falls within a predetermined threshold value (for example, the minimum value of the $R_{SSD}$ value is smaller than the threshold value), coordinates of the origin Z of the reference image 201 when the matching score is the highest is calculated as matching coordinates ($X_{target}$, $Y_{target}$). The matching coordinates are calculated in the coordinate system of the target image 202.

On the other hand, if the highest matching score does not fall within a predetermined threshold value (for example, the minimum value of the $R_{SSD}$ value is larger than the threshold value), the matching coordinates are not calculated as a matching failure. As a result, the open/closed state of the chuck pin 26 can be detected based on the matching coordinates when the matching score is high; therefore, the detection accuracy of the open/closed state of the chuck pin 26 is improved. The matching coordinates may be calculated regardless of whether or not the matching score falls within the threshold value.

Next, the detection unit 92 detects the open/closed state of the chuck pin 26 based on the matching coordinates. Specifically, when the degree of similarity between the reference coordinates ($X_{basis\_pos1}$, $Y_{basis\_pos1}$) in the first state and the matching coordinates ($X_{target}$, $Y_{target}$) obtained as described above falls within a predetermined threshold value, it is considered that the recognition that the chuck pin 26 is in the first state by the control unit 9 is correct (that is, the open/closed state of the chuck pin 26 being in the first state is detected). For example, the similarity here is to calculate the Euclidean distance between two coordinates and determine whether the value falls within the above threshold value.

On the other hand, when the above similarity does not fall within a predetermined threshold value, it is considered that the recognition that the chuck pin 26 is in the first state by the control unit 9 is incorrect, and the similarity between the reference coordinates ($X_{basis\_pos2}$, $Y_{basis\_pos2}$) in the second state and the above matching coordinates ($X_{target}$, $Y_{target}$). Then, when the similarity between the reference coordinates ($X_{basis\_pos2}$, $Y_{basis\_pos2}$) in the second state the matching coordinates ($X_{target}$, $Y_{target}$) does not fall within a predetermined threshold value, the similarity between the reference coordinates ($X_{basis\_pos3}$, $Y_{basis\_pos3}$) in the third state and the above matching coordinates ($X_{target}$, $Y_{target}$) are further calculated. With such a method, the open/closed state of the chuck pin 26 can be accurately detected.

Figure 9:
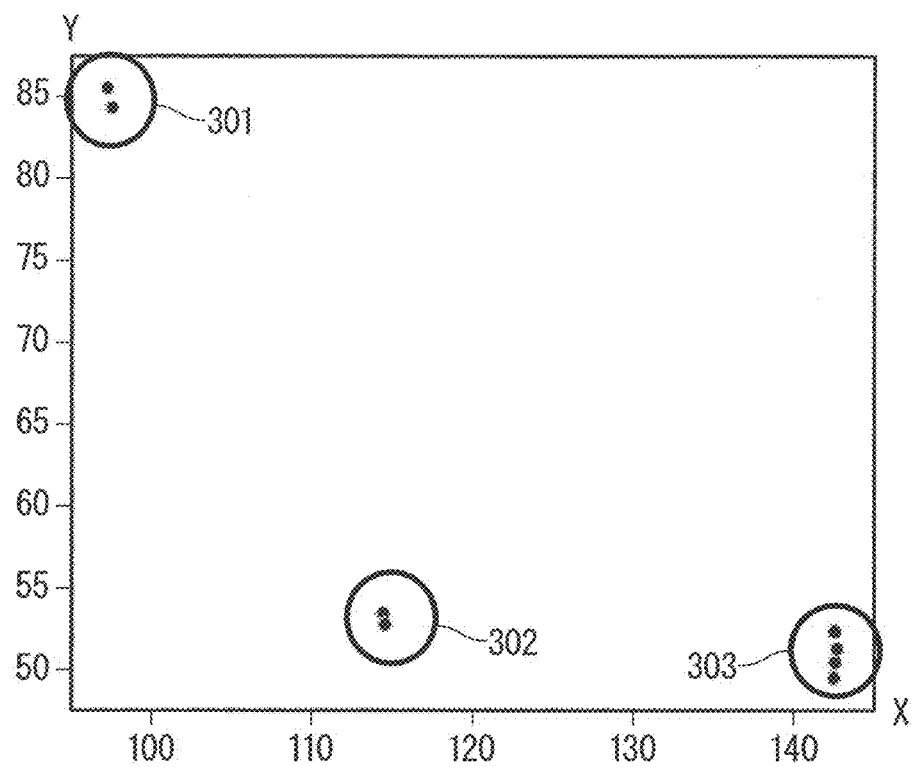
FIG. 9 is a diagram showing an example of distribution of matching coordinates.
Figure 10:
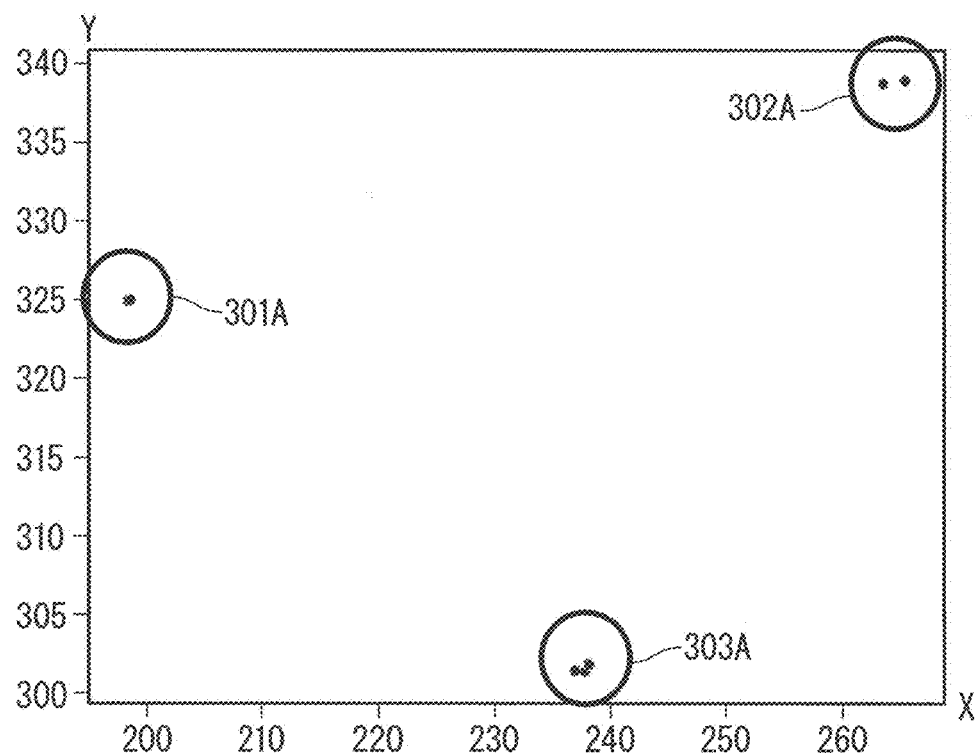
FIG. 10 is a diagram showing an example of distribution of matching coordinates.

FIGS. 9 and 10 are diagrams showing an example of distribution of matching coordinates. FIG. 9 shows the distribution of the matching coordinates of the chuck pin 26b in FIGS. 7 and 8. FIG. 10 shows the distribution of matching coordinates of the chuck pin 26d in FIGS. 7 and 8. In FIGS. 9 and 10, the vertical axis represents an example of the Y coordinate of the coordinate system provided in the target image (numerical values are an example), and the horizontal axis represents an example of the X coordinate of the coordinate system provided in the target image (numerical values are an example).

FIGS. 9 and 10 show the results of pattern matching processing with a plurality of target images corresponding to the respective reference images, with the second state of the different chuck pins 26 are set as reference images. In FIGS. 9 and 10, Range 301, Range 301A, Range 302, Range 302A, Range 303 and Range 303A indicate predetermined ranges each centered on the reference coordinates in the first state, the second state, and the third state. In Range 301 and Range 301A, the matching coordinates when the chuck pin 26 in the target image 202 is in the first state are located (Range 301 and Range 301A correspond to the range of the threshold value when calculating the similarity of the first state described above). Also, in Range 302 and Range 302A, the matching coordinates when the chuck pin 26 in the target image 202 is in the second state are located (Range 302 and Range 302A correspond to the range of the threshold value when calculating the similarity of the second state described above). Also, in Range 303 and Range 303A, the matching coordinates when the chuck pin 26 in the target image 202 is in the third state are located (Range 303 and Range 303A correspond to the range of the threshold value when calculating the similarity of the third state described above).

As shown in FIGS. 9 and 10, the range in which the matching coordinates are located is clearly divided depending on the open/closed state (that is, the first state, the second state, and the third state) of the chuck pin 26 in the target image 202. That is, according to the matching coordinates, the open/closed state of the chuck pin 26 in the target image 202 can be clearly distinguished (the same is true of chuck pins other than the chuck pin 26b and the chuck pin 26d shown in FIGS. 9 and 10). Therefore, the detection unit 92 can detect the open/closed state of the chuck pin 26 by determining to which range the calculated matching coordinates belong.

Here, when the matching coordinates are not included in any of Range 301, Range 301A. Range 302, Range 302A, Range 303 and Range 303A, the detection unit 92 does not detect the open/closed state of the chuck pin 26. As a result, the open/closed state of the chuck pin 26 can be detected based on the matching coordinates included in an appropriate range; therefore, the detection accuracy of the open/closed state of the chuck pin 26 is improved. When the chuck pin 26 is not in any of the first state, the second state, and the third state, that is, when the substrate W is stranded on the chuck pin 26, or when the chuck pin 26 are failing to grip the substrate W and is in a non-gripping state even though the substrate W is arranged, or the like, the matching coordinates are located at coordinates that are not included in any of Range 301, Range 301A, Range 302, Range 302A, Range 303 and Range 303A.

Although in the above example, the second state of chuck pin 26 has been used as the reference image, even if the other state (i.e., the first state or the third state) is used as the reference image, the open/closed state of the chuck pin 26 in the target image 202 can be detected, similar to the above example, according to the matching coordinates because the range in which the matching coordinates are located is clearly divided according to the open/closed state (that is, the first state, the second state, and the third state) of the chuck pin 26 in the target image 202.

Further, the size or position of Range 301, Range 301A, Range 302, Range 302A, Range 303 and Range 303A including the matching coordinates may be changed depending on the average value of the calculated matching coordinates. However, if the size or position of the range is changed beyond the predetermined threshold range, there may be the chuck pin 26 not driven properly due to deterioration over time; therefore, a warning or the like may be output, when necessary.

Detection of Presence or Absence of Substrate

Range 301, Range 301A, Range 302, Range 302A, Range 303 and Range 303A shown in FIGS. 9 and 10 correspond to matching coordinates indicating different open/closed states of the chuck pin 26 (a state of the chuck pin 26 being completely closed without gripping the substrate W, a state of the chuck pin 26 gripping the substrate W, and a state of the chuck pin 26 being open regardless of the presence or absence of the substrate W). Of the three types of open/closed states, the state of the chuck pin 26 being completely closed without gripping the substrate W is excluded when the chuck pin 26 grips the substrate W, and the state of the chuck pin 26 gripping the substrate W is excluded when the chuck pin 26 does not grip the substrate W; therefore, the range in which the matching coordinates can be included is limited depending on whether or not the chuck pin 26 grips the substrate W.

Therefore, the open/closed state of the chuck pin 26 can be detected, for example, not only in the case where the detection unit 92 performs image analysis (for example, luminance analysis at a position corresponding to the central portion of the spin base 21) of an image showing the spin chuck 20 as shown in FIG. 8, and limits the matching coordinates to Range 301, Range 301A, Range 302, Range 302A, Range 303 or Range 303A by detecting whether or not the chuck pin 26 grips the substrate W, but also within a limited range (within the coordinate range) depending on whether or not the chuck pin 26 grips the substrate W. As a result, detecting the open/closed state of the chuck pin 26 based on the matching coordinates excluded in an appropriate range is suppressed; therefore, the detection accuracy of the open/closed state of the chuck pin 26 is improved.

Extraction Range of Target Image

If a structure other than the chuck pin 26 (for example, a substrate W or water droplets adhering to the periphery of the spin chuck 20) is included in the range of the target image 202, the matching accuracy decreases in some cases.

Therefore, when extracting the target image 202, by setting the extraction range so as to have a longitudinal direction along the outer edge portion 400 of the substrate W, a structure other than the chuck pin 26 are suppressed from being included in the image (at least, the range in which the structure other than the chuck pin 26 is included in the image is reduced), and mismatching can be suppressed.

Figure 11:
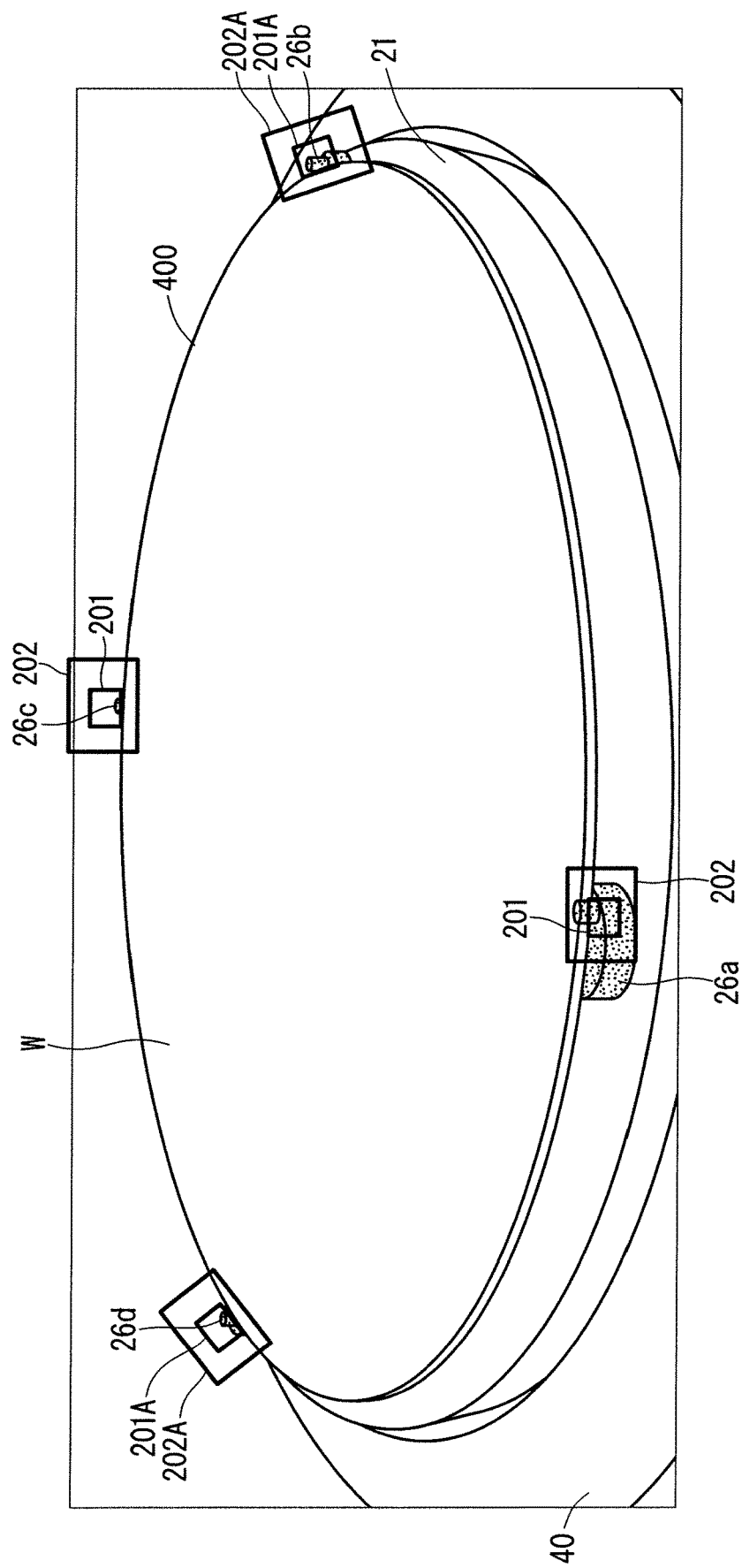
FIG. 11 is a diagram showing an example of extraction of a target image.

FIG. 11 is a diagram showing an example of extraction of the target image. As an example is shown in FIG. 11, the extraction range of the target image 202A is set so as to have a longitudinal direction along the outer edge portion 400 of the substrate W. Accordingly, a structure other than the chuck pin 26 is avoided from being included in the target image 202A.

Although the extraction range of the target image 202 has been described above, the extraction range of the reference image 201A may also have a longitudinal direction along the outer edge portion 400 of the substrate W.

Modification of Embodiment Described Above

Although in the embodiment described above, the qualities of materials of, materials of, dimensions of, shapes of, relative arrangement relationships, or conditions of implementation of each component may also be described, they are illustrative in all aspects and are not limited to those described herein.

Accordingly, it is understood that numerous other modifications variations, and equivalents can be devised without departing from the scope of the technique disclosed in the present application. For example, a case where modifying at least one component, a case where adding or omitting components are included.

Further, in the above-described embodiment, when a material name or the like is described without being specified, the material contains other additives, for example, an alloy or the like, so far as consistent with the embodiments.

While the invention has been shown and described in detail, the foregoing description is in all aspects illustrative and not restrictive. It is therefore understood that numerous modifications and variations can be devised without departing from the scope of the invention.

What is claimed is:

1. A state detection method comprising the steps of:
   obtaining at least one image including a portion of at least one chuck pin for holding the substrate, as a reference image;
   obtaining at least one image obtained by photographing at least a part of the chuck pin, as a target image;
   performing matching processing between the reference image and the target image and calculating matching coordinates, which are coordinates indicating a position of the reference image in the target image when a matching score between the reference image and the target image is the highest; and
   detecting an open/closed state of the chuck pin based on the matching coordinates,
   wherein the reference image includes an image of the chuck pin in the open state, the closed state where the substrate is held, and the closed state where the substrate is not held, and
   the chuck pin in the reference image is in any of the open state, the closed state where the chuck pin holds the substrate, and the closed state where the chuck pin does not hold the substrate.

2. The state detection method according to claim 1, wherein a range indicated by the reference image corresponds to a part of a range in the target image.

3. The state detection method according to claim 1, wherein the reference image is an image excluding the substrate.

4. The state detection method according to claim 1, wherein the chuck pin in the reference image is in any of an open state, a closed state where the chuck pin holds the substrate, and a closed state where the chuck pin does not hold the substrate.

5. The state detection method according to claim 1, wherein the step of obtaining the reference image is a step of obtaining a plurality of the reference images corresponding to each of a plurality of the chuck pins, and the step of obtaining the target image is a step of obtaining a plurality of the target images by photographing the chuck pin shown in each reference image.

6. The state detection method according to claim 1, further comprising a step of A state detection method comprising the steps of:
   obtaining at least one image including a portion of at least one chuck pin for holding the substrate, as a reference image;
   obtaining at least one image obtained by photographing at least a part of the chuck pin, as a target image;
   performing matching processing between the reference image and the target image and calculating matching coordinates, which are coordinates indicating a position of the reference image in the target image when a matching score between the reference image and the target image is the highest; and
   detecting an open/closed state of the chuck pin based on the matching coordinates, and detecting whether or not the substrate is held by the chuck pin, wherein the step of detecting the open/closed state of the chuck pin is a step of detecting the open/closed state of the chuck pin based on which coordinate range the matching coordinates are included, the in a coordinate range limited depending on whether or not the substrate is held by the chuck pin to correspond to each of a first state where the chuck pin does not hold the substrate and are closed, a second state where the chuck pin holds the substrate and a third state where the chuck pin is open, which are prepared as the reference images showing the states of the chuck pin.

7. The state detection method according to claim 1, wherein at least one of the range of the reference image and the range the target image has a longitudinal direction along an outer edge portion of the substrate held by the chuck pin.

8. The state detection method according to claim 1, wherein in the step of obtaining the reference image, coordinates of a predetermined pixel corresponding to the reference image is set to reference coordinates, and a threshold value is set based on the reference coordinates, and in the step of detecting the open/closed state of the chuck pin, the open/closed state of the chuck pin is detected depending on whether or not the matching coordinates fall within the range of the threshold value as compared with the reference coordinates.

9. A state detection device comprising:

at least one chuck pin for holding a substrate;

a photographing unit configured to photograph at least a part of the chuck pin, and set at least one image to be obtained as a target image;

a matching coordinate calculation unit calculator configured to perform matching processing between the target image and a reference image which is at least one image including a part of the chuck pin, and calculate matching coordinates, which are coordinates indicating a position of the reference image in the target image when a matching score between the reference image and the target image is the highest; and a detection unit detector configured to detect an open/closed state of the chuck pin based on the matching coordinates, wherein the reference image includes an image of the chuck pin in the open state, the closed state where the substrate is held, and the closed state where the substrate is not held, and the chuck pin in the reference image is in any of the open state, the closed state where the chuck pin holds the substrate, and the closed state where the chuck pin does not hold the substrate.

10. A state detection device comprising:

at least one chuck pin for holding a substrate;

a photographing unit configured to photograph at least a part of the chuck pin, and set at least one image to be obtained as a target image;

a matching calculator configured to perform matching processing between the target image and a reference image which is at least one image including a part of the chuck pin, and calculate matching coordinates, which are coordinates indicating a position of the reference image in the target image when a matching score between the reference image and the target image is the highest; and a detector configured to detect an open/closed state of the chuck pin based on the matching coordinates, wherein the detector is configured to detect whether or not the substrate is held by the chuck pin, and the detector detects the open/closed state of the chuck pin based on which coordinate range the matching coordinates are included, the coordinate range limited to correspond to each of a first state where the chuck pin does not hold the substrate and are closed, a second state where the chuck pin holds the substrate and a third state where the chuck pin is open, which are prepared as the reference images showing the states of the chuck pin.

* * * * *